United States Patent [19]
Lin et al.

[11] Patent Number: 5,841,195
[45] Date of Patent: Nov. 24, 1998

[54] SEMICONDUCTOR CONTACT VIA STRUCTURE

[75] Inventors: Yih-Shung Lin, Carrollton; Lun-Tseng Lu, Grand Praire; Fu-Tai Liou, Carrollton; Che-Chia Wei, Plano; John Leonard Walters, Carrollton, all of Tex.

[73] Assignee: STMicroelectronics, Inc., Carrollton, Tex.

[21] Appl. No.: 448,703

[22] Filed: May 24, 1995

Related U.S. Application Data

[60] Continuation of Ser. No. 71,561, Jul. 26, 1993, abandoned, which is a division of Ser. No. 832,088, Feb. 6, 1992, Pat. No. 5,246,883.

[51] Int. Cl.$^6$ .................................................. H01L 23/532
[52] U.S. Cl. ......................... 257/774; 257/644; 257/650; 438/637; 438/640; 438/701
[58] Field of Search .................................. 257/635, 637, 257/648, 644, 650, 750, 752, 760, 774, 632, 634; 438/637, 638, 639, 640, 700, 701

[56] References Cited

U.S. PATENT DOCUMENTS

| | | | |
|---|---|---|---|
| 4,299,024 | 11/1981 | Piotrowski | 257/370 |
| 4,476,156 | 10/1984 | Brinker et al. | 427/82 |
| 4,587,138 | 5/1986 | Yau et al. | 427/88 |
| 4,835,597 | 5/1989 | Okuyama et al. | 257/634 |
| 5,041,397 | 8/1991 | Kim et al. | 437/240 |
| 5,068,711 | 11/1991 | Mise | 257/760 |

FOREIGN PATENT DOCUMENTS

| | | |
|---|---|---|
| 0 282 820 | 9/1988 | European Pat. Off. . |
| 0 388 862 | 9/1990 | European Pat. Off. . |
| 62-1246 | 1/1987 | Japan .................... 437/240 |

OTHER PUBLICATIONS

Patent Abstract of Japan, vol. 011, No. 294 (E 544), Sep. 22, 1987 for Japan Publication No. 62–094959, May 1, 1987.
North et al., "Tapered Windows in Phosphorus–doped SiO$_2$ by Ion Implantation," IEEE Transactions on Electron Devices, vol. ED–25, No. 7 (Jul. 1978), pp. 809–812.
Runyan, et al., "Spin–On Glasses," Semiconductor Integrated Circuit Processing Technology, pp. 152.–153.
Plasma Etching: An Introduction, edited by Manos and Flamm p. 164 (1989).
J. Electrochem. Soc., vol. 137, No. 10, Oct. 1990, pp. 3183–3188, by Shacham–Diamonnd et al., "The Characterization of the Residual Film Formed by Plasma Etching of Polysiloxane Spin–on–Glass on Aluminum".
J. Electrochem. Soc., vol. 137, No. 1, Jan. 1990, pp. 196–200, by Woo et al., "Characterization of Spin–On Glass Using Fourier Transform infrared Spectroscopy".
J. Electrochem. Soc.: Accelerated Brief Communication, Sep. 1982, pp. 2152–2154, by Ray et al., "Spin–On Glass as an Intermediate Layer in a Tri–Layer Resist Process".
Mat. Res. Soc. Symp. Proc., vol. 72, 1986 Materials Research Society, pp. 41–45, by Buchanan et al., "Glass Films and Interfaces in Microelectronics Applications".

(List continued on next page.)

*Primary Examiner*—David S. Hardy
*Attorney, Agent, or Firm*—David V. Carlson; Theodore E. Galanthay; Lisa K. Jorgenson

[57] ABSTRACT

A method is provided for forming contact via in an integrated circuit. Initially, a first buffer layer is formed over an insulating layer in an integrated circuit. The first buffer layer has a different etch rate from the insulating layer. A second buffer layer is then formed over the first buffer layer, with the second buffer layer having an etch rate which is faster than the first buffer layer. An isotropic etch is performed to create an opening through the second buffer layer and a portion of the first buffer layer. Because the second buffer layer etches faster than the first buffer layer, the slant of the sidewalls of the opening can be controlled. An anisotropic etch is then performed to complete formation of the contact via.

24 Claims, 2 Drawing Sheets

OTHER PUBLICATIONS

Mat. Res. Soc. Symp. Proc., vol. 260, 199 Materials Research Society, pp. 335–340, by Weling et al., "Improved Planarization for a SOG Etchback process by Modifying the PECVD Oxide Film".

Solar Energy Materials 5 (1981), pp. 159–172, by Brinker et al., "Sol–Gel Derived Antireflective Coatings for Silicon".

J. Material Science 16 (1981), pp. 1980–1988, by Brinker et al., "Conversion of Monolithic Gels to Glasses in Multi-component Silicate Glass System".

Thin Solid Films, 77 (1981), pp. 141–148, Metallurgical and Protective Coatings, by Brinker et al., "Comparisons of Sol–Gel–Derived Thin Films with Monoliths in a Multi-component Silicate Glass System".

"Planarization with Spin–on–Glass/EPCVD Composite Films", pp. 52–53, by Dupuis et al.

SEMICONDUCTOR CONTACT VIA STRUCTURE

CROSS REFERENCE TO RELATED APPLICATION

This application is a continuation of U.S. patent application Ser. No. 08/971,561, filed Jul. 26, 1993, now abandoned, which is a division of U.S. patent application Ser. No. 07/832,088, filed Feb. 6, 1992, now issued as U.S. Pat. No. 5,246,883.

BACKGROUND OF THE INVENTION

1. Field of the Invention

The present invention relates generally to integrated circuits, and more specifically to a method for forming contact vias in integrated circuits.

2. Description of the Prior Art

As integrated circuit devices become more complex, greater numbers of interconnect layers are required to connect the various sections of the device. Generally contact vias are formed between interconnect layers to connect one layer to another. When multiple layers of interconnect are used in this manner, difficulties arise in forming upper interconnect layers and contact vias due to the uneven topographical features caused by the lower interconnect layers. The uneven topographical features of multiple interconnect layers are caused by forming the various interconnect layers above each other, resulting in the creation of hills and valleys on the surface of the device. Thus, the topography of contact vias and interconnect layers affects the ease of manufacturing of the integrated circuit device.

Those skilled in the art will recognize it is difficult to get upper interconnect layers to maintain constant cross-sections when crossing over uneven topography. This leads to portions of the interconnect signal lines having a higher current density, leading to electromigration problems and related device failure mechanisms. Furthermore, step coverage problems can result in voids and other defects in the interconnect signal lines themselves, and in the contact vias formed between the interconnect lines.

During the manufacturing process it is common to perform various techniques in an attempt to maintain a more planar topography. One technique known in the art is the deposition of phosphorous or boron doped reflow glass. The reflow glass tends to cover the hills and fill in the valleys on the surface of the device, resulting in a more planar surface. This technique however, requires a high temperature treatment in order for the glass to flow and stabilize. The high temperature treatment can be undesirable when the manufacturing process also requires silicidation of a refractory metal. Typically, refractory metals silicided can not sustain high temperatures.

Another problem encountered when forming contact vias is the creation of sharp corners in the sidewalls of the opening. Those skilled in the art will recognize that it is difficult to get overlying layers to adequately cover the sharp corners. For example, when aluminum is deposited over a via with sharp corners, the layer is thinner at the sharp corners. This thinning of the layer can also cause electromigration problems and related device failure mechanisms.

Various techniques are used to alleviate the formation of sharp corners in vias. In one technique the contact via is formed by first performing an isotropic etch through a portion of a layer, followed by an anisotropic etch to complete formation of the opening. As those skilled in the art know, the resulting contact profile is not always free from sharp corners. Sharp corners can be formed at the top edges of the portions of the opening that are formed by the isotropic etch and the anisotropic etch.

Therefore, it would be desirable to provide a method for forming contact vias which are free from sharp corners and also result in a planarized topography. It is also desirable that such a method can be performed at low to medium temperatures. Finally, it is desirable that such a method not significantly increase the complexity of the manufacturing process.

SUMMARY OF THE INVENTION

According to the present invention, a method is provided for forming contact vias in an integrated circuit. Initially, a first buffer layer is formed over an insulating layer in an integrated circuit. The first buffer layer has a different etch rate from the insulating layer. A second buffer layer is then formed over the first buffer layer, with the second buffer layer having an etch rate which is faster than the first buffer layer. An isotropic etch is performed to create an opening through the second buffer layer and a portion of the first buffer layer. Because the second buffer layer etches faster than the first buffer layer, the slant of the sideswalls of the opening can be controlled. An anisotropic etch is then performed to complete formation of the contact via.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
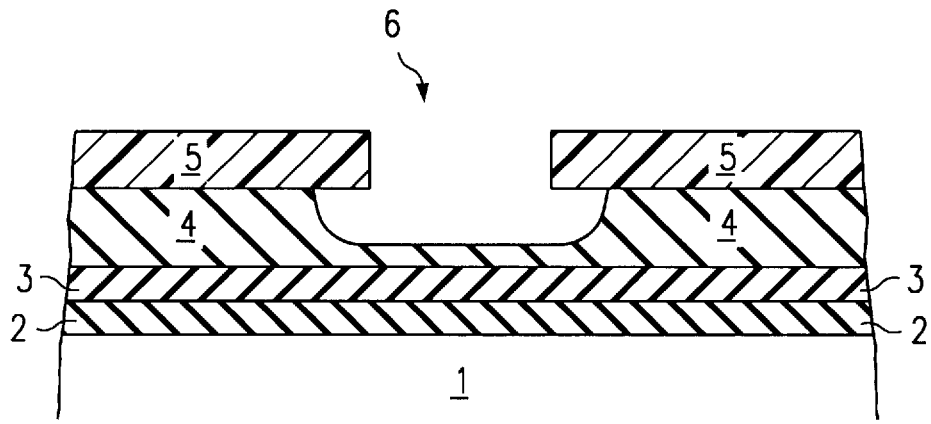
FIGS. 1–2 are sectional views of an integrated circuit illustrating a prior art method of forming a contact via.
Figure 2:
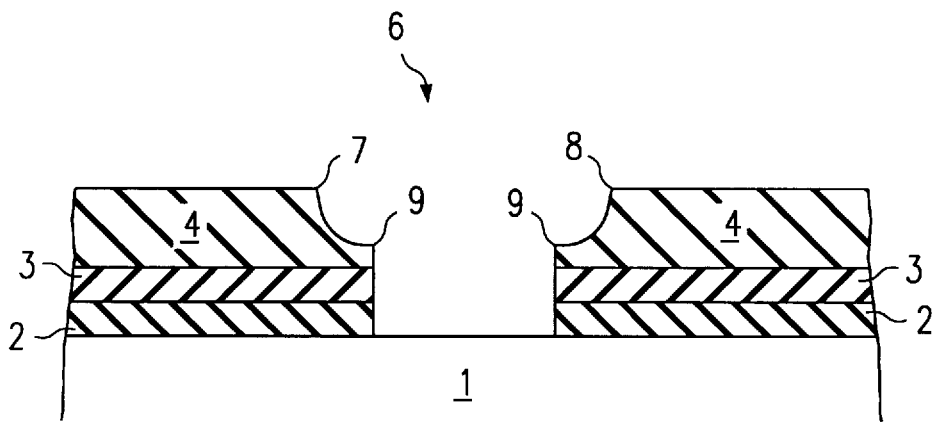

FIGS. 1 and 2 depict a prior art method for forming a contact via structure in an integrated circuit. Referring to FIG. 1, a contact structure will be built on an underlying region 1 in an integrated circuit. The underlying region 1 can be either a semiconductor substrate or an underlying interconnect layer. An insulating layer 2 is deposited over the device, followed by a first buffer layer 3. A second buffer layer 4 is then deposited over the first buffer layer 3. A photoresist mask 5 is deposited on the second buffer layer 4, and patterned to define the location of a contact via. An opening 6 is created in the second buffer layer 4 by performing an isotropic etch. As can be seen, the sidewalls of the opening 6 are curved and sharp corners 7,8 are formed as a result of the istropic etch. Those skilled in the art will recognize that the sharp corners 7,8 can cause step coverage problems.

FIG. 2 illustrates the device after an anisotropic etch is performed to complete formation of the contact via 6, and the photoresist mask 5 is removed. The anisotropic etch also creates sharp corners 9 in the sidewalls of the contact via 6. Again, the sharp corners 9 can cause step coverage problems.

Figure 3:
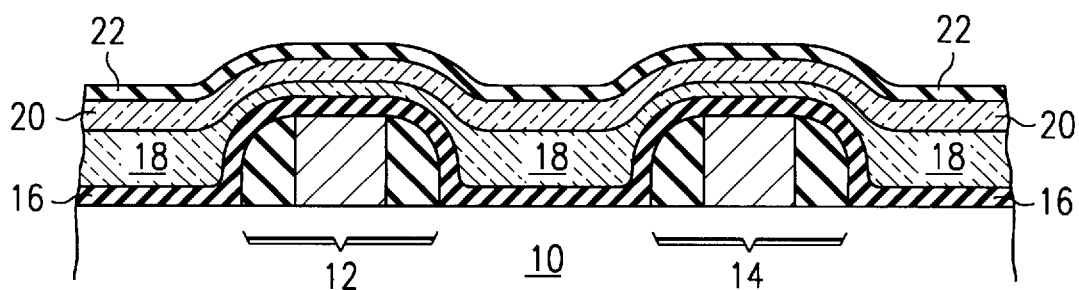
FIGS. 3–7 are sectional views of an integrated circuit illustrating a preferred method for forming contact vias according to the present invention.

FIGS. 3–7 depict a preferred method for forming contact vias in an integrated circuit. Referring to FIG. 3, a contact structure will be built on an underlying region 10 in an integrated circuit. The underlying region 10 can be either a semiconductor substrate or an underlying interconnect layer. Interconnect or component structures 12, 14 are formed on the underlying region 10. An insulating layer 16 is then deposited over the device. A planarizing layer 18 is deposited over the insulating layer 16, followed by the deposition of a first buffer layer 20. Finally, a second buffer layer 22 is deposited over the first buffer layer 20. Together the four layers 16, 18, 20, 22 form an interlevel dielectric layer.

In one example of the preferred embodiment, the insulating layer 16 is made of undoped oxide, while the planarizing layer 18 comprises a phosphorus doped spin on glass containing approximately one to two percent phosphorus. The phosphorus doped spin on glass is annealed at approximately 400 to 500 degrees Celsius, and cured at approximately 700 degrees Celsius. An advantage to using the phosphorus doped spin on glass is that it creates a planarized surface at low to medium temperatures. The first buffer layer 20 is preferably made of phosphosilicate glass containing approximately one to four percent phosphorus, and the second buffer layer 22 preferably comprises phosphorus doped oxide containing approximately six to eight percent phosphorus. The first and second buffer layers 20, 22 can be deposited either by atmospheric or low pressure CVD. This results in the second buffer layer 22 having a faster etch rate than the first buffer layer 20.

Selection of the planarizing and buffer layers 18, 20, 22 however, is not limited to these examples. Materials with different etch rates can be used so long as the second buffer layer 22 can be etched faster than the first buffer layer 20. In order to avoid under cutting the contact, it is desirable that the first buffer layer 20 etch slower than the planarizing layer 18. This allows formation of a contact opening having a "y" shaped profile, as will now be described.

Figure 4:
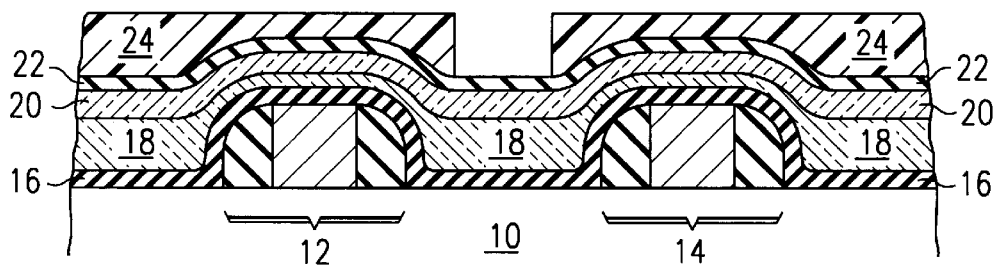

FIG. 4 illustrates the device after a photoresist layer 24 is deposited and patterned on the second buffer layer 22. The photoresist layer 24 is patterned and defined using methods known in the art.

Figure 5:
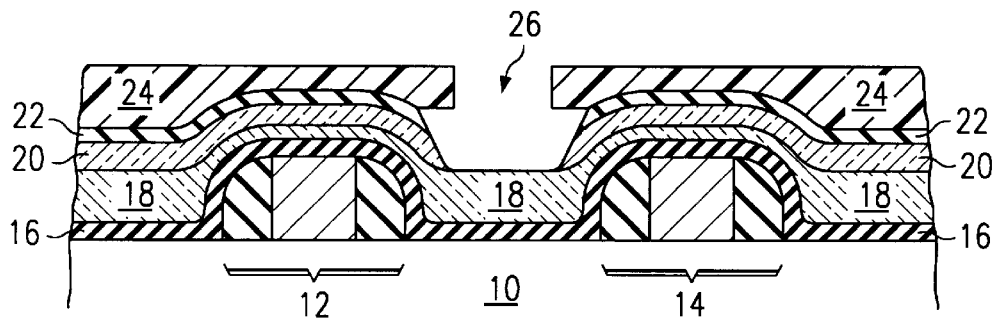

Referring to FIG. 5, an isotropic etch is performed to form an opening 26 through the first and second buffer layers 20,22. Because the second buffer layer 22 etches faster than the first buffer layer 20, diagonally sloped sidewalls are created in the opening 26. The diagonally sloped sidewalls help to reduce step coverage problems typically encountered with contact structures.

Figure 6:
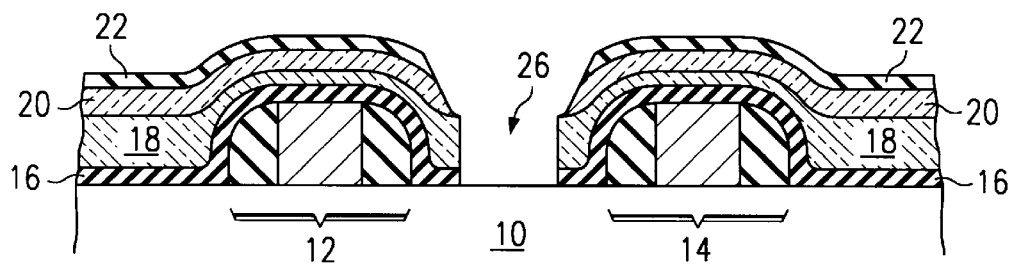

FIG. 6 illustrates the device after an anisotropic etch is performed to complete formation of the opening 26, and the photoresist layer 24 is removed. It is possible to remove the second buffer layer 22 during a contact preclean step, as an alternative to having the second buffer layer 22 remain on the device as shown in FIG. 6.

Figure 7:
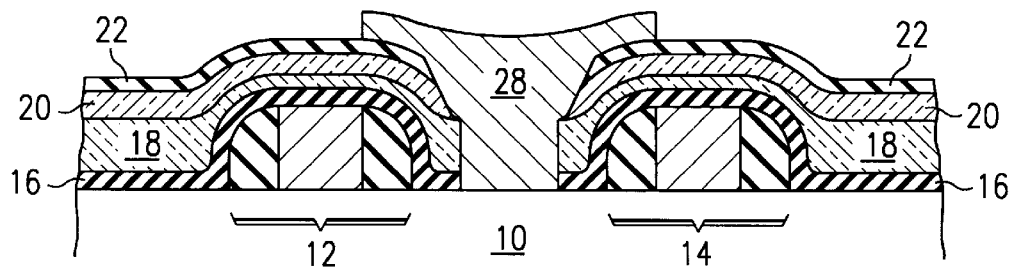

Referring to FIG. 7, a layer of conductive material 28 is deposited and patterned in the opening 26, thereby making electrical contact with the underlying region 10. The integrated circuit is now ready for further processing steps.

The above described process provides a method for controlling the slope of the sidewalls in a contact structure. By selecting materials with varying etch rates, the slope of the vertical sidewalls in the contact structure can be controlled. Those skilled in the art will recognize that controlling the slope of the sidewalls helps in alleviating step coverage problems. This has the desirable effect of creating a planarized topography. Furthermore, the process is done at low to medium temperatures, a desirable feature for manufacturing processes requiring silicidation of refractory metals.

While the invention has been particularly shown and described with reference to a preferred embodiment, it will be understood by those skilled in the art that various changes in form and detail may be made therein without departing from the spirit and scope of the invention.

What is claimed is:

1. A via structure in an integrated circuit comprising:
   a base layer;
   an undoped oxide layer overlying and in contact with the base layer;
   a planarization layer of a planarizing material overlying the undoped oxide layer;
   a first buffer layer overlying said planarization layer, the first buffer layer having a first level of dopants therein;
   a second buffer layer overlying the first buffer layer at a buffer junction, the second buffer layer having a second level of dopants therein, the second level of dopants in the second buffer layer being substantially higher than the first level of dopants in the first buffer layer, and the first and second levels of dopants being unequal at the buffer junction;
   an opening extending through the first buffer layer, the second buffer layer, the planarization layer and the undoped oxide layer, the opening exposing a portion of the base layer and the opening having an upper region at the first and second buffer layers having a gradually increasing diameter caused by the first and second buffer layers having a sloped profile at a less inclined angle than the profile of the opening of said undoped oxide layer and said planarization layer; and
   a conductive layer overlying portions of the second buffer layer and extending into the opening, and making electrical contact with the base layer.

2. The via structure of claim 1, wherein the base layer comprises a semiconductor substrate.

3. The via structure of claim 1, wherein the opening has a lower portion adjacent to the planarization layer and wherein the lower portion of the opening has substantially vertical sidewalls.

4. The via structure of claim 1, wherein the first buffer layer has a phosphorous dopant concentration of between 1% and 4%.

5. The via structure of claim 4, wherein the second buffer layer has a phosphorous dopant concentration of between 6% and 8%.

6. The via structure of claim 1, wherein the second buffer layer has a phosphorous dopant concentration of between 6% and 8%.

7. An integrated circuit vertical interconnection structure, comprising:
   a conductive element;
   an insulating structure, which is at least partially planarized, overlying the conductive element;

a first buffer layer overlying said insulating structure, said first buffer layer being phosphosilicate glass with a uniform first phosphorous doping level;

a second buffer layer overlying the first buffer layer at a junction, said second buffer layer having a second uniform phosphorous doping level substantially higher than the first phosphorous doping level, and the doping level discontinuous at the junction;

an opening through the first and second buffer layers, and the insulating structure, the opening exposing a portion of the conductive element and having an upper portion adjacent to the first and second buffer layers wherein the upper portion of the opening has a conical sidewall profile, the opening having a lower portion adjacent to the insulating structure; and a conductive layer overlying portions of the second buffer layer and extending into the opening, wherein the conductive layer makes an electrical contact with the conductive element.

8. The structure of claim 7, wherein said second phosphorous doping level is at least 50% higher than said first phosphorous doping level.

9. The structure of claim 7, wherein said second phosphorous doping level is at least three times as high as that of said insulating structure.

10. The structure of claim 7, wherein said insulating structure comprises spin-on glass.

11. The structure of claim 7, wherein the conductive element comprises a semiconductor substrate.

12. The structure of claim 7, wherein the lower portion of the opening has substantially vertical sidewalls.

13. The structure of claim 7, wherein the first buffer layer has a phosphorous dopant concentration of between 1% and 4%.

14. The structure of claim 7, wherein the second buffer layer has a phosphorous dopant concentration of between 6% and 8%.

15. A via structure in an integrated circuit, comprising:

a conductive element;

an oxide layer overlying the conductive element;

a spin on glass layer overlying the oxide layer;

a first buffer layer overlying the spin on glass layer and having a first doping concentration of a dopant that is substantially uniformly distributed within the first buffer layer;

a second buffer layer overlying the first buffer layer and having a second doping concentration of the dopant that is substantially uniformly distributed within the second buffer layer, the second doping concentration higher than the first doping concentration;

an opening through the first and second buffer layers, the spin on glass layer, and the oxide layer, the opening exposing a portion of the conductive element and having a first portion adjacent to the first and second buffer layers wherein the first portion of the opening has a sloped profile; and a conductive layer overlying portions of the second buffer layer and extending into the opening, wherein the conductive layer makes an electrical contact with the conductive element.

16. A via structure in an integrated circuit, comprising:

a conductive element;

an oxide layer overlying the conductive element;

a spin on glass layer overlying the oxide layer;

a first buffer layer overlying the spin on glass layer and having a first doping concentration of a dopant that is substantially evenly distributed within the first buffer layer;

a second buffer layer overlying the first buffer layer and having a second doping concentration of the dopant that is substantially evenly distributed within the second buffer layer, the second doping concentration higher than the first doping concentration;

an opening through the first and second buffer layers, the spin on glass layer, and the oxide layer, the opening exposing a portion of the conductive element and having a first portion adjacent to the first and second buffer layers wherein the first portion of the opening has sloped sidewalls; and a conductive layer overlying portions of the second buffer layer and extending into the opening, wherein the conductive layer makes an electrical contact with the conductive element.

17. In an integrated circuit, a via structure comprising:

a substrate;

an insulating layer partially covering the substrate;

a first etching layer covering the insulating layer, the first etching layer doped with a first concentration of dopant and etchable throughout the entire first layer at a first rate;

a second etching layer covering a portion of the first etching layer, the second etching layer doped with a second concentration of dopant and etchable throughout the entire second etching layer at a second rate, the second rate being faster than the first rate;

an opening through the insulating layer and the first and second etching layers, the opening being substantially vertical through the insulating layer and being less vertical through the etching layers; and a connection layer substantially filling the opening and contacting the substrate, insulating layer, and etching layers.

18. The via structure of claim 17 wherein the insulating layer further comprises:

an oxide layer; and a planarizing layer.

19. The via structure of claim 18 wherein the planarizing layer comprises a spin on glass layer.

20. The via structure of claim 19 wherein the spin on glass comprises a phosphosilicate glass.

21. The via structure of claim 17 wherein the second concentration is higher than the first concentration.

22. The via structure of claim 21 wherein the first concentration is 1–4%.

23. The via of claim 17 wherein the second concentration is 6–8%.

24. The via of claim 17 wherein the connection layer comprises a refractory metal layer.

* * * * *